(12) United States Patent
Chaudhury et al.

(10) Patent No.: US 9,158,005 B2
(45) Date of Patent: Oct. 13, 2015

(54) X-RAY DETECTOR

(71) Applicant: Siemens Aktiengesellschaft, Munich (DE)

(72) Inventors: Shameem Kabir Chaudhury, Erlangen (DE); Thorsten Ergler, Forchheim (DE); Björn Kreisler, Hausen (DE); Thomas Reichel, Heroldsbach (DE); Christian Schröter, Bamberg (DE); Peter Sievers, Uttenreuth (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/564,149

(22) Filed: Dec. 9, 2014

(65) Prior Publication Data

US 2015/0177388 A1    Jun. 25, 2015

(30) Foreign Application Priority Data

Dec. 19, 2013    (DE) .......................... 10 2013 226 671

(51) Int. Cl.
*H01L 27/146* (2006.01)
*G01T 1/175* (2006.01)

(52) U.S. Cl.
CPC ...................................... *G01T 1/175* (2013.01)

(58) Field of Classification Search
CPC ............... G01T 1/17; G01T 1/00; G01T 7/00; G01T 1/243; G01T 1/244; G01T 1/24; G01T 1/2928; H01L 27/14676
See application file for complete search history.

(56) References Cited

U.S. PATENT DOCUMENTS

| 3,654,469 | A | * | 4/1972 | Kantor | ........................ 250/385.1 |
| 5,693,947 | A | * | 12/1997 | Morton | .................... 250/370.09 |
| 5,852,296 | A | | 12/1998 | Tsukamoto et al. | |
| 5,946,178 | A | | 8/1999 | Bijlenga | |
| 7,187,012 | B2 | | 3/2007 | Walters | |
| 2003/0030054 | A1 | * | 2/2003 | Hector et al. | .................... 257/72 |
| 2007/0011358 | A1 | | 1/2007 | Wiegert et al. | |
| 2010/0051823 | A1 | * | 3/2010 | Brenner et al. | ................ 250/389 |

FOREIGN PATENT DOCUMENTS

DE    102010027128 A1    1/2012

OTHER PUBLICATIONS

German Search Report dated Dec. 11, 2014 issued in corresponding German Application No. 102013226671.5.

* cited by examiner

*Primary Examiner* — Kiho Kim
(74) *Attorney, Agent, or Firm* — Harness, Dickey & Pierce, P.L.C.

(57) ABSTRACT

An X-ray detector is disclosed. According to an embodiment of the invention, the X-ray detector includes at least two adjacently arranged detector elements, to each of which a high voltage is applied in order to detect incident X-rays. In this case, two adjacent detector elements are coupled to one another by way of a protection circuit, designed to limit a voltage difference between the two adjacent detector elements to a voltage value which is non-critical with regard to the formation of a flashover between the two detector elements.

8 Claims, 2 Drawing Sheets

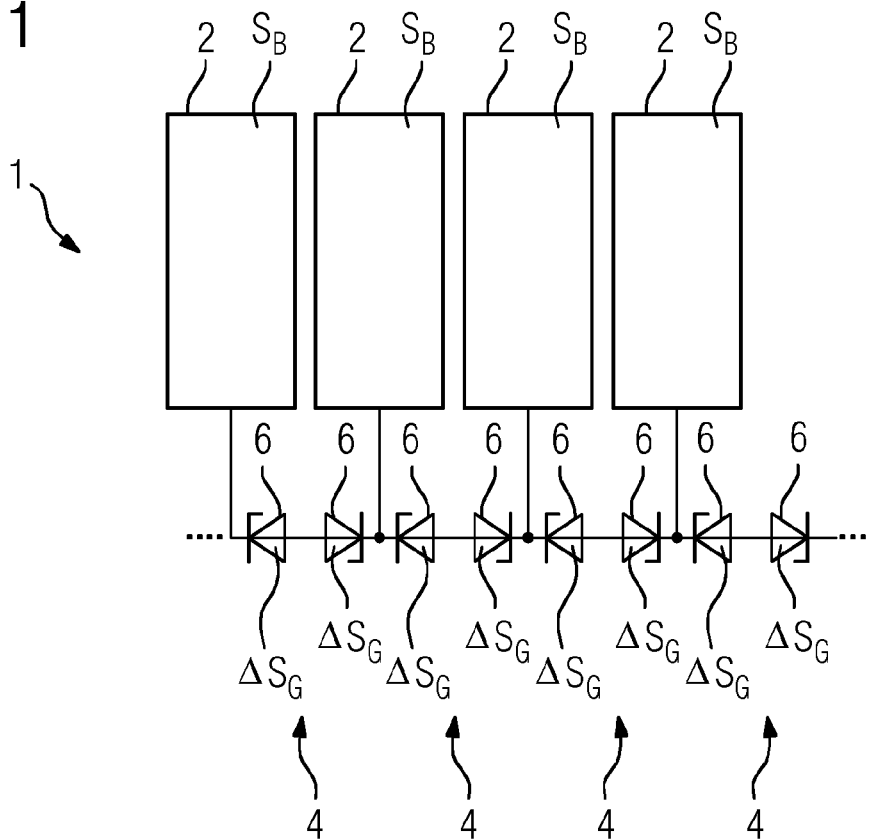
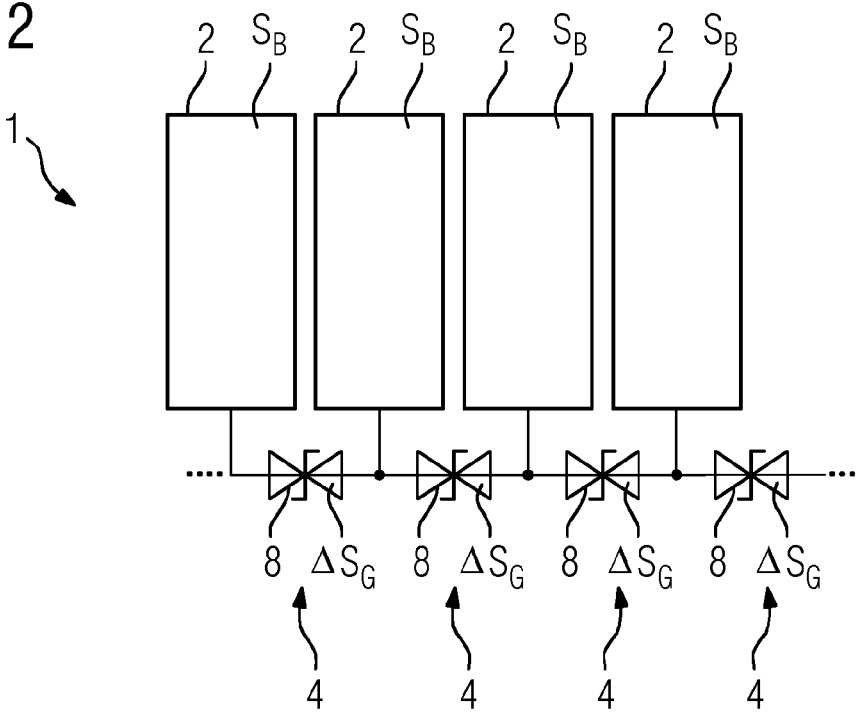

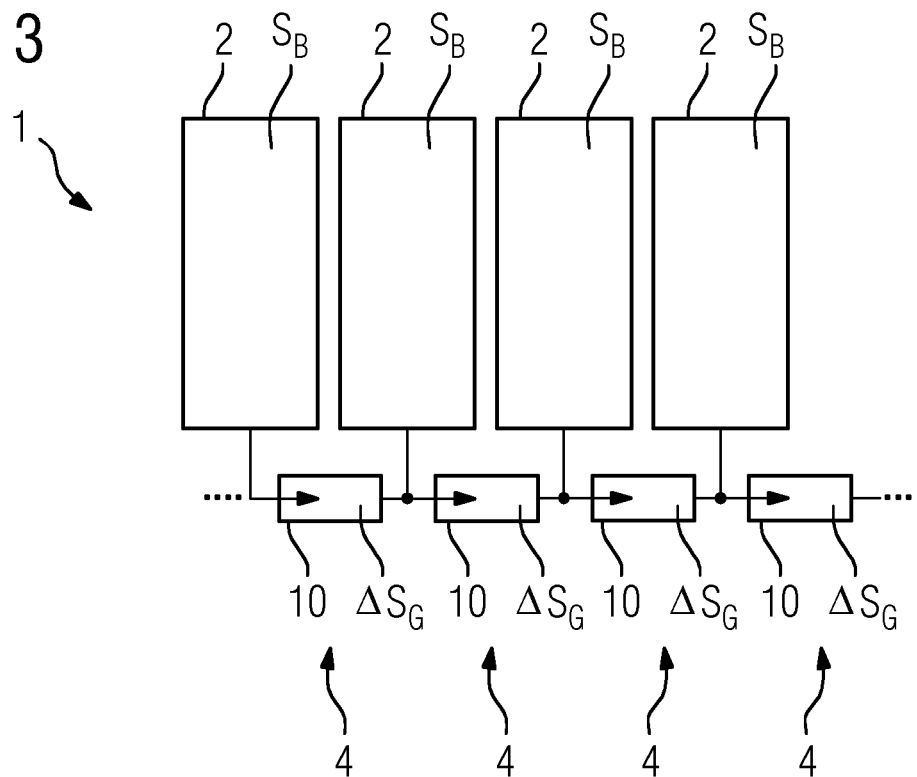
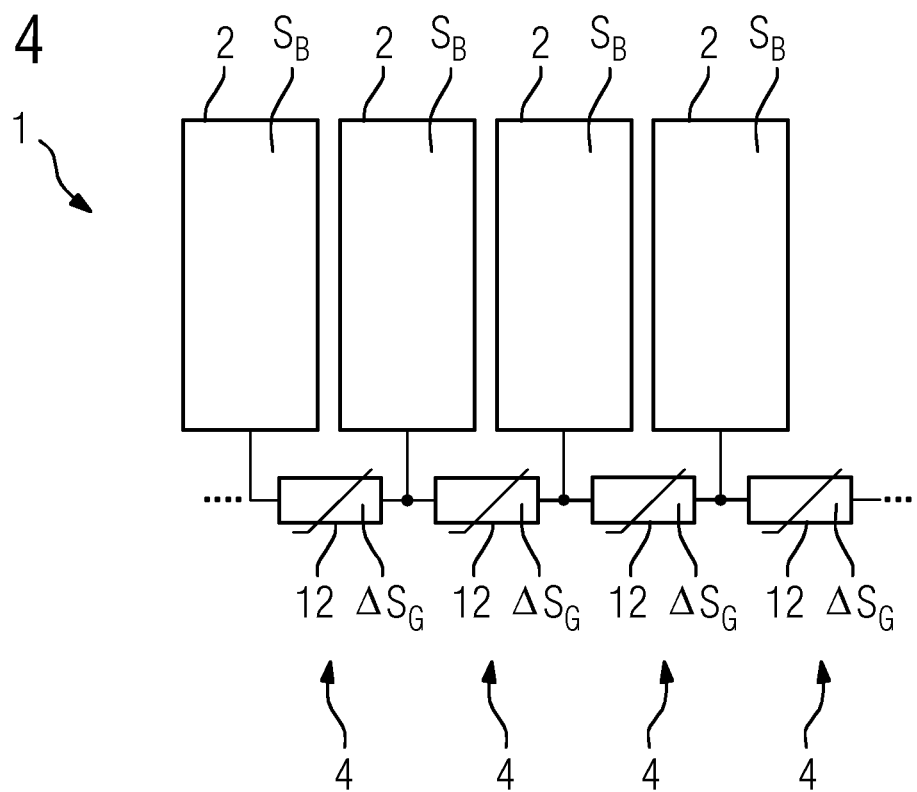

X-RAY DETECTOR

PRIORITY STATEMENT

The present application hereby claims priority under 35 U.S.C. §119 to German patent application number DE 102013226671.5 filed Dec. 19, 2013, the entire contents of which are hereby incorporated herein by reference.

FIELD

At least one embodiment of the invention relates to an X-ray detector, in particular an X-ray detector for a computed tomography system.

BACKGROUND

X-ray detectors for the acquisition of X-rays, in particular quantum-counting X-ray detectors, have a sensor layer which is sensitive to X-rays and which is coupled to an evaluation electronics unit. The sensor layer is conventionally formed from a semiconductor material (for example amorphous selenium, a gallium arsenide or cadmium telluride compound or the like). Upon the incidence of X-rays, electron hole pairs (charge carriers of negatively or positively charged charge) are formed in the sensor layer. The charge carriers in turn each form a positive and negative space-charge cloud.

On account of an electrical voltage applied to the sensor layer the charge carriers are separated from one another and move in each case to the oppositely charged electrodes (arranged on the surface of the sensor layer). As a result of the current caused hereby an (electrical) signal is generated in the evaluation electronics unit which is proportional to the energy of the absorbed X-rays. Notwithstanding this, in the case of a quantum-counting X-ray detector individual X-ray quanta (photons) and where applicable the individual quantum energies thereof are detected.

In order to achieve a sufficiently fast transport of the charge carriers (the space-charge clouds) right through the sensor layer, voltages of approximately −300 V to more than −2,000 V—depending on the thickness of the sensor layer—are applied to the sensor layer (corresponding to an electrical field strength of approximately −10 kV/mm).

Large-area X-ray detectors are required in particular for computed tomography systems. The manufacture of continuous sensor layers having an edge length of several tens of centimeters is however technically very complex and has high associated costs. In order to nevertheless be able to produce large-area X-ray detectors as cost-effectively as possible, a plurality of comparatively small (single) detector elements having the structure described above are arranged side by side. The detector elements typically have a sensor area of between 1 and 4 cm$^2$. In order to achieve as high an image quality (in particular a high resolution) as possible the detector elements are moreover arranged at as small a spacing as possible of for example approx. 0.1-05 mm from one another.

A fault situation can occur during operation of the X-ray detector in which the voltage of a detector element deviates from its normal operating voltage. Such a fault situation is present for example in the event of a defect in the voltage supply associated with the detector element or in the evaluation electronics unit. In this case the operating voltage drops significantly at regular intervals, mostly to a voltage value of 0 V. A fault situation can however also occur in the form of a voltage fluctuation, in particular as a result of an overvoltage, where in the latter case the actual voltage of a detector element significantly exceeds the operating voltage. In both fault situations a voltage difference arises between the faulty detector element and the or each (immediately) adjacent detector element. If the voltage difference exceeds a critical voltage value, a (spark) flashover can occur between the two adjacent detector elements. The sensor layer of both detector elements (as well as the evaluation electronics unit thereof) can be destroyed by the flashover. The danger of spark flashovers in the event of a fault is promoted in this situation in particular by the minimal spatial spacing of the detector elements from one another.

SUMMARY

At least one embodiment of the invention is directed to an X-ray detector having high operational reliability.

At least one embodiment of the invention is directed to an X-ray detector. Advantageous and in part per se inventive embodiments and developments of the invention are set down in the subclaims and the following description.

The X-ray detector according to an embodiment of the invention comprises at least two detector elements arranged adjacent to one another. In order to detect incident X-rays an (electrical) high voltage is applied to each of the detector elements during operation. In this situation the high voltage—also referred to as "operating voltage"—preferably has a voltage value of between approx. −500 and −1,500 V, in particular between approx. −900 and −1,000 V. Two adjacent detector elements are coupled in this case by way of a protection circuit. The protection circuit is designed to limit a voltage difference—that is to say the absolute value—between the two adjacent detector elements—that is to say the absolute value of the voltage difference—to a voltage value at which a (spark) flashover between the two detector elements is impossible under normal conditions. This non-critical—with regard to the risk of a spark flashover —voltage value is referred to in the following as voltage limit value. The voltage limit value is preferably chosen as having a sufficiently great safety margin from a critical voltage range in which flashovers must be reckoned with.

BRIEF DESCRIPTION OF THE DRAWINGS

Example embodiments of the invention will be described in detail in the following with reference to a drawing. In the drawings:

FIG. 1 shows a schematic illustration of sections of an X-ray detector having four detector elements arranged side by side, wherein two adjacent detector elements in each case are coupled to one another by way of a protection circuit, and FIG. 2-4 shows in a view according to FIG. 1 alternative embodiments of the protection circuit.

Parts and sizes corresponding to one another are always identified by the same reference characters in all the figures.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The X-ray detector according to an embodiment of the invention comprises at least two detector elements arranged adjacent to one another. In order to detect incident X-rays an (electrical) high voltage is applied to each of the detector elements during operation. In this situation the high voltage—also referred to as "operating voltage"—preferably has a voltage value of between approx. −500 and −1,500 V, in particular between approx. −900 and −1,000 V. Two adjacent detector elements are coupled in this case by way of a protection circuit. The protection circuit is designed to limit a voltage difference—that is to say the absolute value—between the two adjacent detector elements—that is to say the absolute value of the voltage difference—to a voltage value at which a (spark) flashover between the two detector elements is impossible under normal conditions. This non-critical—with regard to the risk of a spark flashover—voltage value is referred to in the following as voltage limit value. The voltage limit value is preferably chosen as having a sufficiently great safety margin from a critical voltage range in which flashovers must be reckoned with.

The X-ray detector preferably comprises a plurality of detector elements (in particular substantially more than two detector elements) which in particular are arranged side by side in a series (also referred to as a "detector row"). In this case the immediately adjacent detector elements of the detector row are each always coupled to one another by way of the protection circuit. Optionally the X-ray detector comprises a sequence of a plurality of such detector rows, such that the detector elements are arranged in a two-dimensional pattern (as a so-called "array"). In this case one detector element of one detector row is preferably also coupled with the nearest detector element of the adjacent detector row by way of the protection circuit.

In the context of at least one embodiment of the invention, the X-ray detector in question can basically include a conventional X-ray detector, for example a "flat-panel detector", which functions on the principle of direct conversion. In the case of such a flat-panel detector, X-rays incident in a sensor layer are immediately absorbed, forming electron hole pairs. The electron hole pairs are separated under the effect of an electrical voltage applied to the sensor layer. In this situation, a signal which cumulatively reflects the energy of many incident X-ray photons is determined by way of an evaluation electronics unit. By preference however, the X-ray detector in question is a quantum-counting (or also photon-counting) X-ray detector. With this, the charge produced by direct conversion and transported through the sensor layer is routed onto the evaluation electronics unit and compared with one or more threshold values in such a manner that individual incident X-ray photons and also their individual quantum energy can be captured.

The detector elements in question are in each case preferably a self-contained module (also referred to as "sensor board"). This comprises in particular the sensor layer consisting of semiconductor material, on the upper and lower sides of which are arranged electrodes for applying the operating voltage. In addition the detector element comprises the evaluation electronics unit associated with the sensor layer (for example a microcontroller or in particular an ASIC).

The fact that in each case two adjacent detector elements are coupled by way of the protection circuit serves to effectively and in failsafe fashion prevent the voltage difference between the two detector elements reaching the critical voltage range. A flashover between the two detector elements is thereby effectively inhibited.

In the event that more than two detector elements are arranged side by side, the protection circuit can advantageously also serve to prevent a flashover from continuing in cascaded fashion (in the manner of the domino effect) in the event of a fault situation affecting a detector element. In the absence of the protection circuit such a domino effect could occur as a result of the fact that on account of a flashover between a first and a second detector element the voltage of the originally "intact" (at operating voltage) second detector element collapses, in particular drops to 0 V. The voltage difference between the second detector element and the third detector element adjacent thereto would thus likewise go into the critical voltage range and possibly trigger a further flashover.

The voltage limit value is preferably adjusted to the mechanical and/or climatic ambient conditions of the detector elements. In this situation the mechanical ambient conditions are in particular given by the spacing between two detector elements. The climatic ambient conditions in question are for example the atmospheric humidity, the temperature and for example the atmospheric pressure for which the detector element is designed. In this situation the ambient conditions regularly influence the critical voltage range in which flashovers between the two adjacent detector elements are to be reckoned with.

In an example embodiment of the X-ray detector, the protection circuit comprises a protective element, preferably in the form of an—in particular bipolar—suppressor diode. The latter is also referred to as transient absorption Zener diode (TAZ diode) or transient voltage suppressor diode (TVS diode). The breakdown voltage of the suppressor diode corresponds here to the voltage limit value. The suppressor diode advantageously exhibits a particularly steep current-voltage characteristic curve as well as a particularly short reaction time (a few nanoseconds). On account of the preferably bipolar implementation of the suppressor diode, an effective protection of both detector elements is moreover achieved by way of only a single component and in addition assembly effort and design space are advantageously reduced.

In an alternative embodiment, the protection circuit comprises two Zener diodes connected anti-serially (in other words, connected in series with opposite polarity) as the protective element. In this situation the breakdown voltage of the Zener diodes again likewise corresponds to the voltage limit value.

In a further alternative embodiment, the protection circuit comprises a voltage-dependent resistor (also referred to as varistor) as the protective element. In this situation the varistor is likewise designed in such a manner that its voltage threshold as of which its conductivity increases abruptly corresponds to the desired voltage limit value.

In a further optional embodiment, the protection circuit comprises a gas-filled overvoltage arrester (gas discharge tube) as the protective element. In the case of such a gas discharge tube, as from the voltage limit value an arc is ignited inside a gas-filled housing between two electrodes, which arc in turn establishes a conductive connection between the two electrodes.

In order to afford additional protection for the detector elements and also where applicable for the respective protection element of the protection circuit itself in the event of a fault situation of extended time duration (in other words over several seconds or longer), in an advantageous embodiment the protection circuit comprises, additionally or as an alternative to one of the protection elements described above, at least one device for interrupting the voltage supply to the detector elements, which, in the case that the voltage difference between the two detector elements exceeds the voltage limit value for a sufficient period of time, interrupt the voltage supply.

As the at least one device for interrupting the voltage supply, a so-called clamping circuit is preferably employed which short-circuits the voltage supply to the detector elements in a fault situation and thereby trips a fuse associated with the X-ray detector. To this end the clamping circuit expediently has a thyristor or a comparable switching element which is triggered by the protection element operating.

Alternatively, in the context of at least one embodiment of the invention, a microprocessor can also be provided as the at least one device for interrupting the voltage supply. The microprocessor is used for example to monitor whether the respective protective element is in the conducting state (in other words whether the voltage limit value has been exceeded). In this case—preferably in the case of an additional threat of overloading the protection element and/or after a waiting time has elapsed—the voltage supply to the detector elements is switched off. As a result of the combination of one of the protection elements described above with the at least one device for interrupting the voltage supply it is possible to effectively prevent the respective protective element from being overloaded or destroyed, in particular thermally (by the high leakage currents possibly occurring), if the voltage limit value is exceeded.

The X-ray detector according to at least one embodiment of the invention is preferably intended for use in a (medical or industrial) computed tomography system. Alternatively, in the context of at least one embodiment of the invention, it is however likewise possible to employ the X-ray detector in another device which has a large-area detector field with a plurality of elements, for example a C-arm X-ray device or an electron microscope with X-ray analysis.

FIG. 1 to FIG. 4 illustrate an example embodiment of an X-ray detector 1. The X-ray detector 1 comprises a plurality of detector elements 2 arranged side by side, of which only four are shown for reasons of simplicity. Each detector element 2 comprises a sensor layer produced from a semiconductor material (for example cadmium telluride) and also an evaluation electronics unit connected to the sensor layer. In order to detect X-rays incident on one of the detector elements 2 a voltage S, specifically a high voltage of −900 V, is applied to the sensor layer (the high voltage is referred to as operating voltage SB in the following). In this situation the front side of the sensor layer facing away from the evaluation electronics unit (and facing the X-ray source) is at a negative potential. The rear side facing the evaluation electronics unit is at a higher potential (for example ground) compared with the front side. This ensures that the electron hole pairs created in the sensor layer by the X-rays are separated and the (negatively charged) electrons "drift" in the direction of the evaluation electronics unit. The electrons generate an electrical signal in the evaluation electronics unit which is characteristic of the X-rays incident into the detector element 2. In this situation the operating voltage SB is made available to each detector element 2 in each case by a high-voltage channel of a power supply unit (not shown in detail).

The individual detector elements 2 are arranged at a particularly small spacing of for example approximately 0.3 mm from one another in order to enable as high an image quality as possible of the X-ray image assembled by way of all the detector elements 2.

During operation, a fault situation can occur in which the voltage S of one of the detector elements 2 drops from the operating voltage SB to a significantly different voltage value of for example 0 V. This fault situation can occur for example on account of a defect on the high-voltage channel associated with the detector element 2 or on account of a damaged evaluation electronics unit. The corresponding detector element 2 is referred to as "defective" in the following.

In a fault situation, a voltage difference $\Delta S$ between the defective detector element 2 and the adjacent detector element 2, which continues at operating voltage SB (referred to as "intact"), thus assumes a high value in terms of absolute value—for the case that the voltage S at the defective detector element is 0 V, the voltage difference $\Delta S$ is therefore specifically 900 V. In this situation the voltage difference $\Delta S$—promoted by the minimal spacing of the detector elements 2 from one another—enters a critical voltage range in which a flashover between the two detector elements 2, in other words a spark or arc between the two detector elements 2, is to be expected. The sensor layers of the two detector elements 2 or the detector elements 2 as a whole can be destroyed by the flashover.

In order to prevent such a flashover, two immediately adjacent detector elements 2 are coupled to one another in each case by way of a protection circuit 4. The protection circuit 4 is designed and intended to limit the voltage difference $\Delta S$ between the two detector elements 2 to a non-critical voltage value (referred to as voltage limit value $\Delta S_G$). In this situation the voltage limit value $\Delta S_G$ has a sufficiently great safety margin from the critical voltage range such that a flashover is effectively prevented.

In the example embodiment according to FIG. 1, the protection circuit 4 comprises two Zener diodes 6 connected anti-serially (in other words, connected in series with opposite polarity). As a result of the anti-serial connection, the current flow between the two adjacent detector elements 2 is blocked in both directions if the voltage difference of adjacent modules is less than the voltage limit value. In this situation the breakdown voltage associated with the Zener diodes, in other words the voltage as of which the Zener diode 6 becomes (current-)conducting, corresponds to the voltage limit value $\Delta S_G$.

In an alternative example embodiment according to FIG. 2, the protection circuit 4 comprises a bipolar suppressor diode 8 instead of the two Zener diodes 6.

In a further alternative example embodiment according to FIG. 3, the protection circuit 4 comprises a gas-filled overvoltage arrester (gas discharge tube 10). An arc is ignited between two electrodes inside a housing of the gas discharge tube 10 if the voltage limit value $\Delta S_G$ is exceeded, which means that current can flow between the two adjacent detector elements 2 and the voltage difference $\Delta S$ can be reduced.

In yet another example embodiment according to FIG. 4, the protection circuit 4 comprises a voltage-dependent resistor, referred to as a varistor 12. The voltage value as of which the (differential) resistance of the varistor 12 abruptly drops (and the current conductivity of the varistor 12 thus increases) again corresponds here to the voltage limit value $\Delta SG$.

In a further example embodiment (not shown in detail), the protection circuit 4 additionally comprises a clamping circuit as well as the bipolar suppressor diode 8. The clamping circuit is designed to additionally interrupt the voltage supply to the detector elements 2 when the respective protection element (here the suppressor diode 8) operates, in other words when the voltage difference $\Delta S$ exceeds the voltage limit value $\Delta S_G$. Because of its comparatively long reaction time, the clamping circuit operates only in the event of fault situations of extended duration.

In the event of a voltage drop of extended duration affecting one of the detector elements 2 this serves to prevent the suppressor diode 8 (which operates more quickly in comparison with the clamping circuit) from being thermally overloaded or destroyed.

The subject matter of the invention is not restricted to the example embodiments described above. Rather, further embodiments of the invention can be derived from the above description by the person skilled in the art. In particular, the individual features of the invention described with reference to the different example embodiments and design variants thereof can also be combined with one another in a different manner.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An X-ray detector, comprising:
    at least two adjacently arranged detector elements, wherein to detect incident X-rays, a high voltage is applied to each of the at least two adjacently arranged detector elements; and
    a protection circuit, to couple two adjacent detector elements, of the at least two adjacently arranged detector elements, to one another, the protection circuit being designed to limit a voltage difference between the two adjacent detector elements to a voltage value which is non-critical with regard to formation of a flashover between the two adjacent detector elements.

2. The X-ray detector of claim 1, wherein the protection circuit comprises a suppressor diode.

3. The X-ray detector of claim 1, wherein the protection circuit comprises two Zener diodes connected anti-serially.

4. The X-ray detector of claim 1, wherein the protection circuit comprises a voltage-dependent resistor.

5. The X-ray detector of claim 1, wherein the protection circuit comprises a gas-filled overvoltage arrester.

6. The X-ray detector of claim 1, wherein the protection circuit comprises at least one device for interrupting the voltage supply to the detector elements.

7. The X-ray detector of claim 1, wherein the X-ray detector is a quantum-counting X-ray detector.

8. The X-ray detector of claim 1, wherein detector elements are arranged approximately 0.3 mm from one another.

* * * * *